United States Patent [19]
Czerwinski et al.

[11] Patent Number: 5,808,240
[45] Date of Patent: Sep. 15, 1998

[54] LOW-INDUCTANCE PLANAR BUS ARRANGEMENT

[75] Inventors: Christopher S. Czerwinski, Shelton; Mark E. Shepard, Plainville, both of Conn.

[73] Assignee: Otis Elevator Company, Farmington, Conn.

[21] Appl. No.: 653,521

[22] Filed: May 24, 1996

[51] Int. Cl.$^6$ .................................................. H01B 17/00
[52] U.S. Cl. ....................................................... 174/149 B
[58] Field of Search .............................. 174/72 B, 88 B, 174/70 B, 99 B, 137 B, 149 B

[56] References Cited

U.S. PATENT DOCUMENTS

| | | | |
|---|---|---|---|
| 2,961,518 | 11/1960 | Hermann | 174/137 B |
| 2,968,781 | 1/1961 | Staskowski | 339/22 |
| 2,985,710 | 5/1961 | Davis et al. | 174/99 |
| 2,989,579 | 6/1961 | Somers | 174/99 |
| 3,091,655 | 5/1963 | Ruiter | 174/32 |
| 3,402,254 | 9/1968 | Parker et al. | 174/133 |
| 3,459,880 | 8/1969 | Erdl | 174/133 |
| 3,550,269 | 12/1970 | Yatabe et al. | 29/624 |
| 3,634,810 | 1/1972 | Pemberton | 339/22 R |
| 3,636,237 | 1/1972 | Hafer | 174/68 B |
| 3,712,953 | 1/1973 | Boersma et al. | 174/133 B |
| 3,852,515 | 12/1974 | Jorgensen et al. | 174/68 C |
| 4,159,504 | 6/1979 | Cook | 361/361 |
| 4,180,845 | 12/1979 | Shariff et al. | 361/334 |
| 4,288,656 | 9/1981 | Olashaw | 174/71 B |
| 4,560,896 | 12/1985 | Vogt et al. | 310/215 |
| 4,603,345 | 7/1986 | Lee et al. | 357/81 |
| 4,809,153 | 2/1989 | Bremer et al. | 363/141 |
| 5,053,918 | 10/1991 | Norden | 361/355 |
| 5,422,440 | 6/1995 | Palma | 174/133 B |
| 5,514,837 | 5/1996 | Kenny et al. | 174/113 R |

FOREIGN PATENT DOCUMENTS 746367  3/1956  United Kingdom .

OTHER PUBLICATIONS

"Power Circuit Design for Third Generation IGBT Modules," E. Motto, *Power Conversion & Intelligent Motion*, Jan. 1994, pp. 1–12, 17–18.

"Snubber Capacitor Size and Characteristics Affect High Power IGBT Module Performance," E. Motto, M. Gebbia, *Power Conversion & Intelligent Motion*, Jun. 1994, pp. 10–12, 14–15, 17–18.

Chapter 5, "General Properties of Insulating Materials," T. W. Dakin, *Electrical Engineering Materials Reference Guide*, McGraw–Hill, 1990, pp. 5–1—5–14.

"Standard Test Method for Detection and Measurement of Partial Discharge (Corona) Pulses in Evaluation of Insulation Systems," *The American Society for Testing and Materials*, 1993, pp. 464–473.

"Design Methodology & Modeling of Low Inductance Planar Bus Structures," G.L. Skibinski, D.M. Divan, *The Eurpean Power Electronics Association*, 1993, pp. 98–105.

Chapters 2 and 4 of, *Engineering Dielectrics*, vol. 1, *Corona Measurements and Intrepretation*, R. Bartinkas, E. J. McMahon, ASTM. Philadelphia, 1979, pp. 22–41 and 124–133.

"A Low Inductance, Simiplified Snubber, Power Inverter Implementation" C. Dimino, R. Dodballapur, J. Pomes, *High Frequency Power Conversion*, Apr. 1994 Proceedings, pp. 502–509.

AEIC Standard 5, *Specifications for Polyethylene and Crosslinked Polyethelyne Insulated Shielded Power Cables Rated 5 Through 69 KV (4th Edition)*, Association of Edison Illminating Companies, Jun. 1974.

*Primary Examiner*—Kristine L. Kincaid
*Assistant Examiner*—Dhiru R. Patel

[57] ABSTRACT

A low inductance bus bar arrangement includes two electrical conductors and an insulating system. The insulation system includes an insulation material and is disposed between the conductors. The insulation material has a thickness equal to or greater than a thickness threshold such that partial discharge in the insulating material is minimized.

7 Claims, 4 Drawing Sheets

LOW-INDUCTANCE PLANAR BUS ARRANGEMENT

TECHNICAL FIELD

The present invention relates generally to bus arrangements and, in particular, relates to planar bus arrangements.

BACKGROUND OF THE INVENTION

The rapid turn-on and turn-off of modern transistors in inverters, such as IGBTs, produce high transient voltages. Since transient voltages are harmful to the transistor and can lead to failure, any transient voltages that occur in power conversion circuits due to fast switching must be limited to safe levels. In order to reduce transient voltages, it is necessary to reduce power wiring inductance and to use transistors with low parasitic inductance. Consequently, many transistor manufacturers today recommend the use of a low inductance bus to interconnect power devices. This is conventionally achieved by having wide, planar conductors placed in close proximity to each other, and separated by thin insulating materials.

A problem lies in the design of an insulation system so that the lifetime of the insulating material is not compromised. The most likely contributor to failure of an insulator under electric field stress is partial discharge. Partial discharge, also referred to as corona, is the ionization of a gas, such as air, within a void or gap in the insulation system when the electric field stress exceeds a critical value. The magnitude of the discharge is dependent on the number and size of the voids within the insulation system.

In the design of a low-inductance planar bus bar, partial discharge is of particular concern. The consequences of allowing discharges to occur anywhere within the insulation system is a significant reduction in the life of the insulating material. Organic insulating materials will ultimately fail when exposed to continuous discharge conditions, and the time to failure usually varies as the inverse of the voltage stress.

Several approaches have been used to minimize the effects of partial discharge on insulation systems. One method, includes controlling the void sizes in the insulation system. In this approach, a manufacturing process that ensures a specific statistical distribution of void sizes is required and is typically accomplished by laminating the insulation system under elevated temperature and pressure conditions. However, this approach is costly as a result of the specialized equipment required to the laminate the material. In addition, the reliability of the insulation system may be directly affected by the ability to control the lamination process.

Another approach includes choosing a material that is resistant to ionization, such as certain inorganic materials. However, inorganic materials add significant cost to the bus arrangement and may not have desirable physical properties.

DISCLOSURE OF THE INVENTION

The present invention is predicated in part on the discovery that a partial discharge free insulation system for a low inductance planar bus arrangement can be achieved without the need for complex and costly techniques for minimizing voids in the insulation system such that life of the insulation system is maximized.

It is an object to avoid the premature degradation of an insulating material in a bus bar arrangement.

It is a further object of the present invention to minimize ionization of a gas an insulation system.

According to the invention, a bus bar arrangement includes two electrical conductors and an insulating system. The insulation system includes an insulation material and is disposed between the conductors. The insulation material has a thickness equal to or greater than a thickness threshold such that partial discharge in the insulating material is minimized.

In one embodiment, the thickness threshold is determined in accordance with the following relationship:

$$\delta_{d\_THRESHOLD} = \epsilon_d \times \left( \frac{PD_{THRESHOLD}}{\beta \times 650} \right)^2$$

wherein
$\delta_{d\_THRESHOLD}$ the threshold thickness;
$\epsilon_d$ is a dielectric constant of the insulation material;
$PD_{THRESHOLD}$ is a partial discharge voltage threshold; and
$\beta$ is a coeffiecient which is selected as follows:
$\beta=1$ for inception voltage under uniform fields
$\beta=0.67$ for inception voltage under non-uniform field (33% reduction)
$\beta=0.85$ for extinction voltage under uniform fields (15% reduction)
$\beta=0.57$ for extinction voltage under non-uniform fields.

The thickness threshold is selected so that a partial discharge voltage threshold is greater than an applied voltage to the conductors.

The present invention provides the advantage of minimizing partial discharge in the insulation system. Accordingly, the presence of voids in the insulation system does not compromise the long term reliability of the insulation system. The need to control void size in the manufacturing process is minimized and costly lamination techniques are not required. In addition, edge sealing to eliminate air gaps around the perimeter of the bus bar assembly and at through holes is not required. The insulation material may include organic materials as a result of the minimized partial discharge conditions.

BEST MODE FOR CARRYING OUT THE INVENTION

The aforementioned objects and advantages may be best achieved by implementation of a low inductance bus bar arrangement constructed in accordance with the principles of the present invention.

Figure 1:
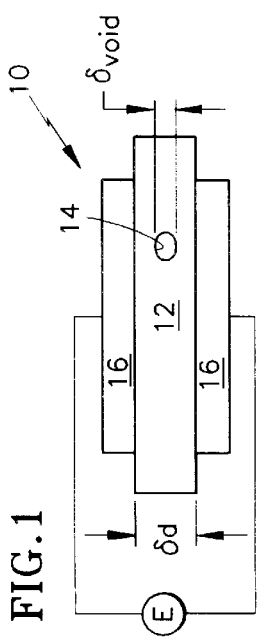
FIG. 1 is a simplified diagram of one embodiment of a bus bar assembly.

Referring to FIG. 1, an insulating system 10 comprising an insulating material d and a simplified void 14 is disposed between two copper conductors 16 with an applied voltage of E. The simplified void 14, in one example, includes air disposed within the insulating material 12. The insulating system 10 also may comprise a void between the conductors 16 and the insulating material 12. The insulating material 12 has a thickness $\delta_d$ and a dielectric constant $\epsilon_d$. The voltage E at which ionization of the air, or partial discharge ("p.d."), occurs in the void is derived as follows. Assuming a uniform electric field, the voltage across the dielectric material d and the air satisfy:

$$E = E_{air} + E_d.$$

Using capacitive voltage divider relations, the voltage in the air void can be written:

$$E_{air} = E \frac{C_d}{C_d + C_{air}}$$

where $C_{air}$ and $C_d$ are the capacitance's of the air and the dielectric, respectively. Using the relation for capacitance $$C = \epsilon \frac{A}{\delta}$$

where A is the effective capacitive area and substituting yields:

$$E_{air} = E \left[ \frac{C_d}{C_d + C_{air}} \right] = E \left[ \frac{\frac{\epsilon_d A}{\delta_d}}{\frac{\epsilon_d A}{\delta_d} + \frac{\epsilon_{air} A}{\delta_{air}}} \right] = E \frac{\epsilon_d \delta_{air}}{\epsilon_d \delta_{air} + \epsilon_{air} \delta_d}.$$

Now solving for voltage stress in the air $$\frac{E_{air}}{\delta_{air}} \text{ (v/mil)},$$

and using the fact that $\epsilon_{air} = 1$, $$\boxed{\frac{E_{air}}{\delta_{air}} = E \frac{\epsilon_d}{\epsilon_d \delta_{air} + \delta_d}}.$$

Equation 1. Voltage Stress in Air Voids under Uniform Electric Field.

Partial discharge will occur when the voltage stress in the air is greater than the breakdown stress for air:

$$\boxed{\frac{E_{air}}{\delta_{air}} > \frac{E_{breakdown}}{\delta_{air}}}.$$

Equation 2. Condition for Partial Discharge.

Figure 2:
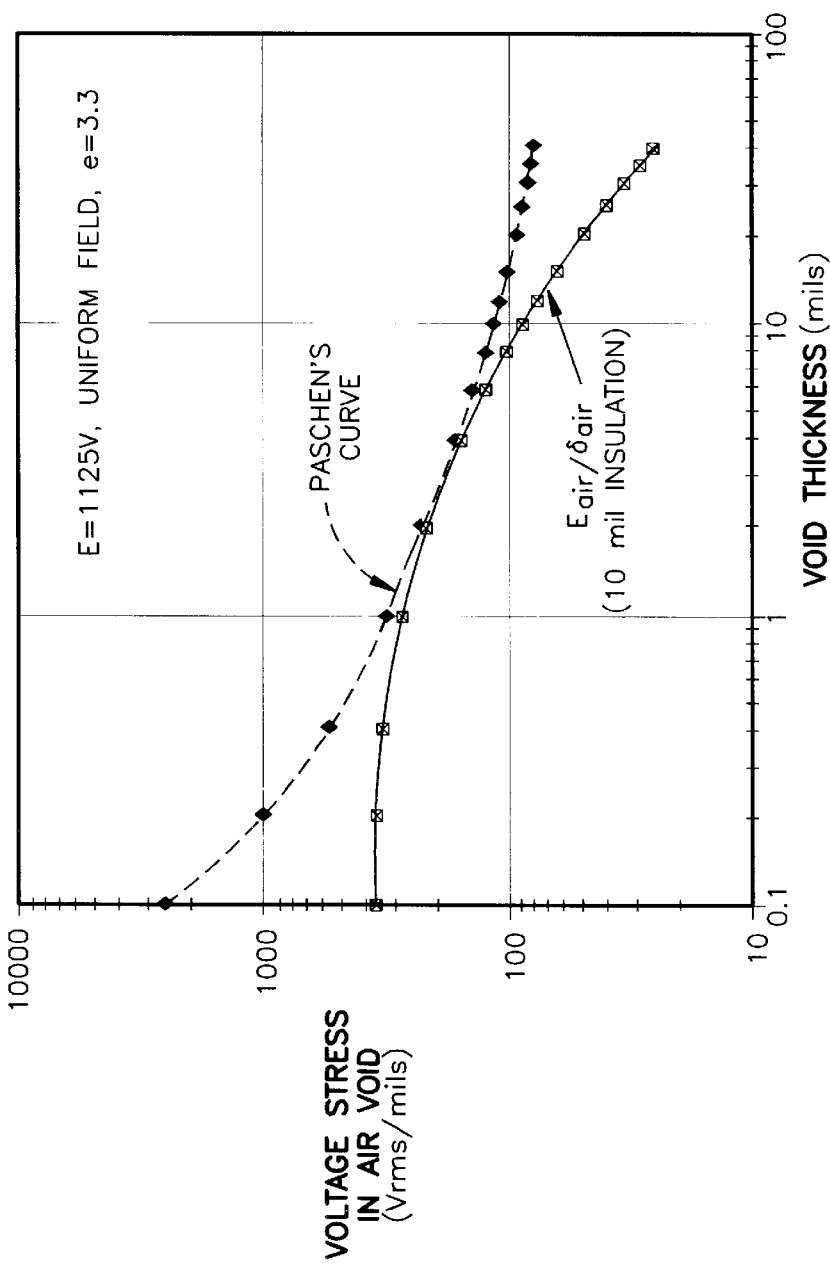
FIG. 2 is a graphical illustration of the relationship between voltage stress and void thickness.

Referring to FIG. 2, the breakdown stress for air is well understood and is known as Paschen's curve. Equation 1 and Paschen's curve versus void thickness are shown in FIG. 2 for an insulating material having thickness 10 mils (10 * one thousandth of an inch) and a dielectric constant 3.3. As applied voltage E is increased, partial discharge commences where the two curves in FIG. 2 intersect (defined as the partial discharge inception voltage, "PDIV"). However, once partial discharge occurs, it takes slightly less energy to sustain, and as the applied voltage E is reduced, another lower voltage threshold is reached where partial discharge no longer exists. This lower voltage threshold is defined as partial discharge extinction voltage ("PDEV"). It has been determined empirically that PDEV is typically 15% lower than PDIV. The PDIV and the PDEV are collectively defined as the p.d. voltage thresholds.

Figure 3:
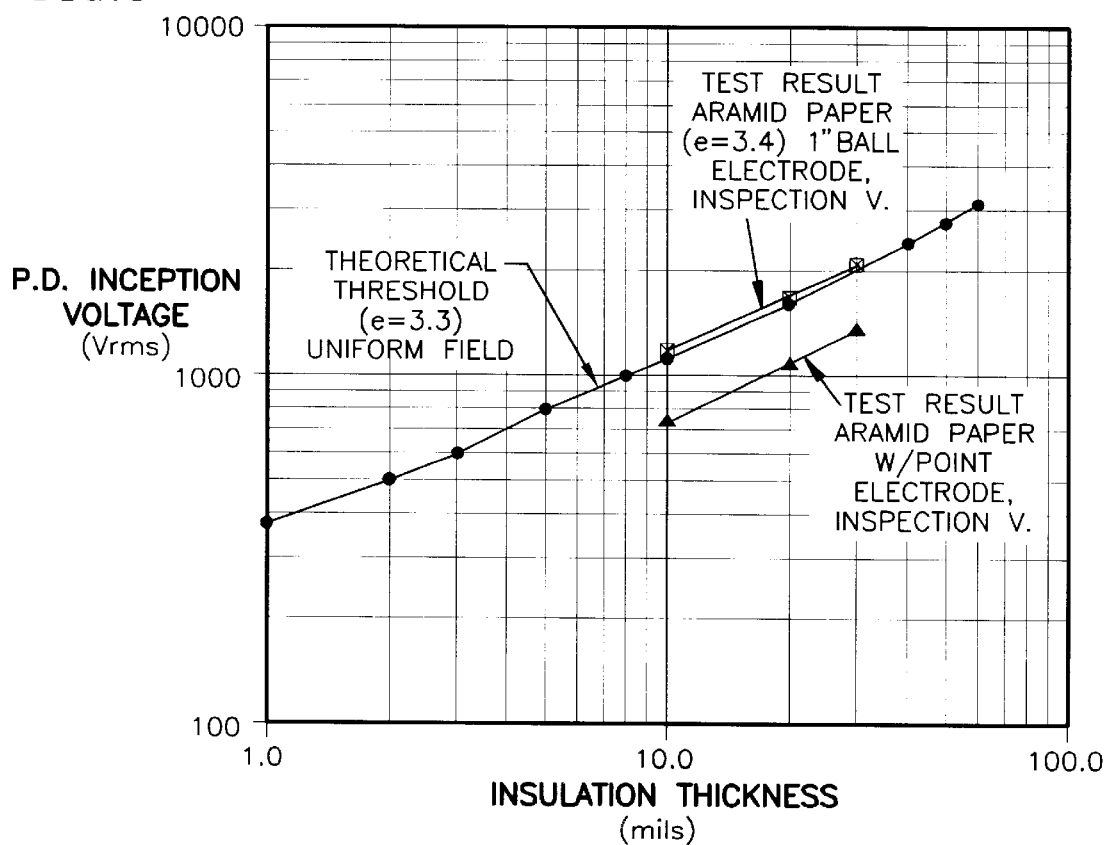
FIG. 3 is a graphical illustration of the relationship between partial discharge inception voltage and insulation thickness.

For the case shown in FIG. 2, the PDIV is 1125 volts and the void thickness is approximately 2 mils. Accordingly, the PDEV is determined to be 956 volts (15% reduction of PDIV). If this process is repeated for different insulation thicknesses, a relation between PDIV and insulation thickness is derived. This relation is shown in FIG. 3 for e=3.3, along with a few test points using an aramid paper insulating material. The relation between PDEV and insulation thickness is determined by reducing the PDIV by 15%.

Referring to FIG. 3, the relation between the p.d. voltage threshold and insulation thickness is used to determine an insulation thickness threshold. The insulation thickness threshold is the minimum insulation thickness for which partial discharge in the insulating system is minimized for a determined applied voltage. Thus, the threshold insulation thickness is determined by finding the minimum insulation thickness on the graph that ensures that the applied voltage of the bus bar arrangement is below both the PDIV and the PDEV.

One test result shown in FIG. 3 was produced using 1 inch ball electrodes in order to maintain uniform electric field conditions. This test yielded results in fair agreement with the theoretical calculations. However, in a practical application, the conductors may have sharp edges which produce non-uniform electric fields, creating local areas of increased stress. Moreover, it has been shown empirically that sharp-edge electrodes reduce the voltage thresholds by approximately 33%. Accordingly, another test result is shown in FIG. 3 which was produced using point electrodes.

Alternatively, the relation between the p.d. voltage thresholds and insulation thickness threshold is approximated by the following equation:

$$\delta_{d\_THRESHOLD} = \epsilon_d \times \left( \frac{PD_{THRESHOLD}}{\beta \times 650} \right)^2 \qquad \text{Eq. 3}$$

wherein $\delta_{d\_THRESHOLD}$ is the threshold thickness;
$\epsilon_d$ is a dielectric constant of the insulation material;
$PD_{THRESHOLD}$ is a partial discharge voltage threshold; and
$\beta$ is a coeffiecient which is selected as follows:
$\beta=1$ for inception voltage under uniform fields
$\beta=0.67$ for inception voltage under non-uniform field (33% reduction)
$\beta=0.85$ for extinction voltage under uniform fields (15% reduction)
$\beta=0.57$ for extinction voltage under non-uniform fields.
Equation 3. Determination of partial discharge threshold.

Accordingly, the insulation thickness threshold can be determined by implementing equation 3 as is described hereinbelow.

An important relationship illustrated in Equation 3 is that the insulation thickness threshold decreases with materials having a lower dielectric constant. Accordingly, organic materials, for example, such as polypropylene, polyester and aramid paper may be used as insulating materials in the bus bar arrangement of the present invention as is explained hereinbelow.

Figure 4:
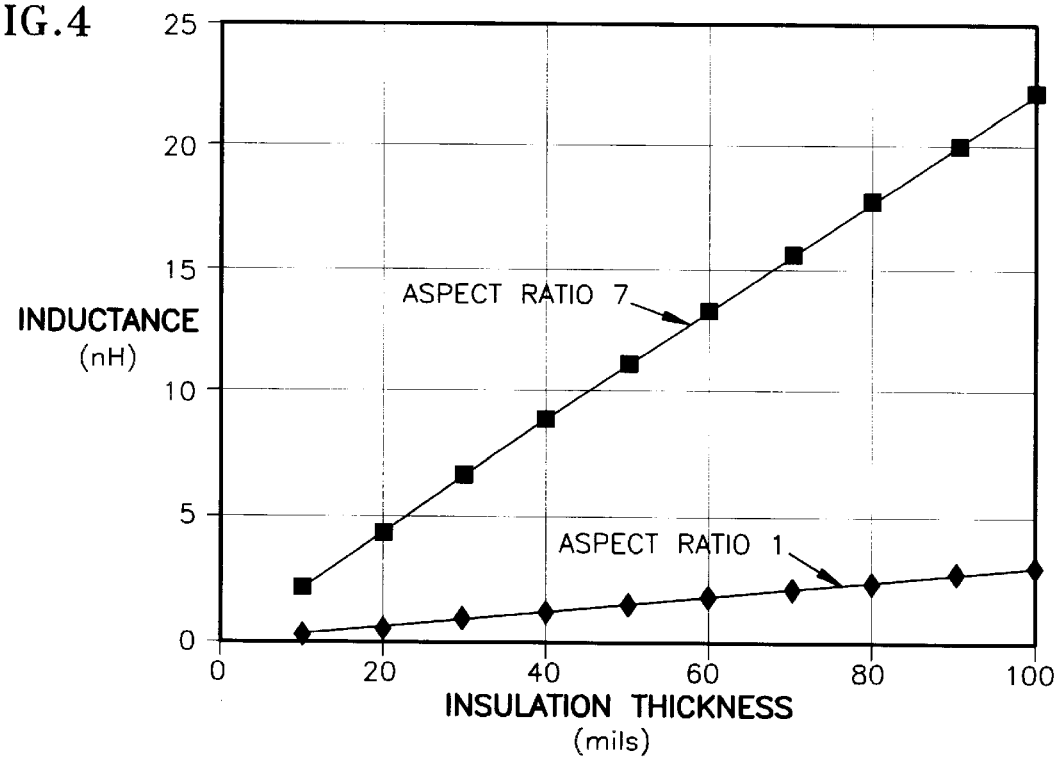
FIG. 4 is a graphical illustration of the relationship between inductance and insulation thickness.

Referring to FIG. 4, another important factor in the implementation of the low inductance bus bar arrangement is to minimize inductance. Inductance is related to insulation material thickness as follows:

$$L = 31.9 \delta_d \frac{l}{w} \;(nH),$$

where l and w are the length and width of the conductor, and $\delta_d$ is the distance separation of the conductors (thickness of the insulator). A plot of inductance versus insulation thickness is shown in FIG. 4 with conductor aspect ratios (l/w) equal to 1 and 7.

In one embodiment, a target inductance for a low inductance bus bar in an inverter application is 10 nH. The target inductance is determined as a percentage of the total inductance in the application. For example, a pair of large transistor modules may include 50 nH of inductance, and a capacitor may contain 17 nH inductance. Accordingly, 15% of the total inductance (50+17) is 10 nH.

Given the target inductance, a wide range of insulation thicknesses can be tolerated as shown in FIG. 4, provided the conductor aspect ratio is appropriate. Furthermore, the dielectric constant is not related to inductance and can be chosen independently. Consequently, it is possible to design a p.d. free insulation system by minimizing the dielectric constant $\epsilon_d$ and selecting the appropriate dielectric thickness $\delta_d$ based on the relation shown in FIG. 3 or Equation 3, without eliminating air voids. The appropriate dielectric thickness is chosen such that it is greater than or equal to the threshold thickness.

Thus, the present invention provides for a p.d. free low inductance bus bar, regardless of the size of any air voids, because the relation is derived considering all possible void sizes in the insulating system. This simplifies the construction of the insulating system because special techniques to control the size of air voids, such as lamination, are not required.

Figure 5:
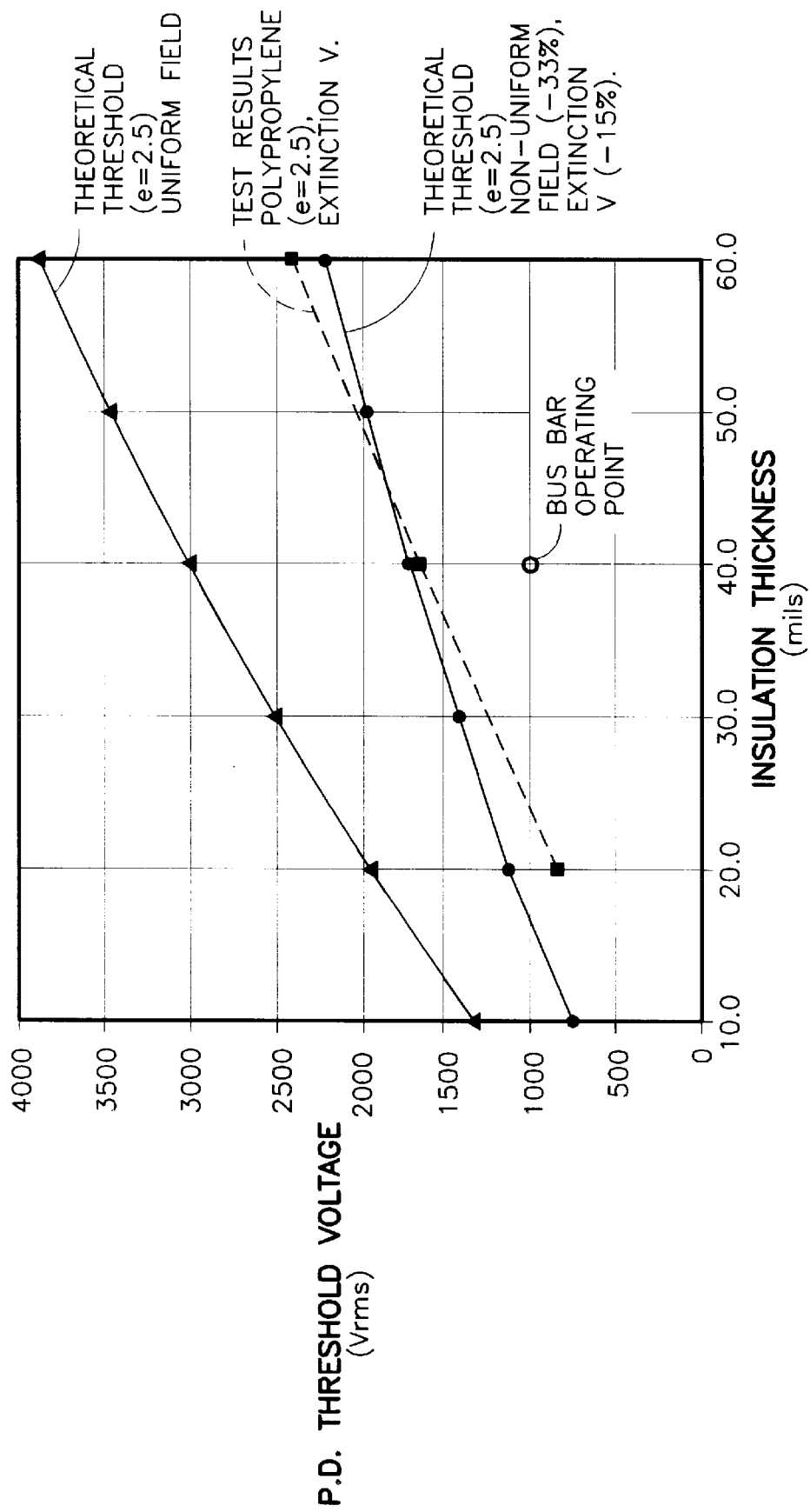
FIG. 5 is a graphical illustration demonstrating an example of determining an insulation thickness threshold.

Referring to FIG. 5, an example of determining the insulation thickness threshold is shown. In this example, an applied voltage of 1 kV, a target inductance of 10 nH, an aspect ratio of 7 and a polypropylene insulating material ($\epsilon_d$=2.5) are used in the low inductance bus bar arrangement. Tests were conducted using various thicknesses of the polypropylene insulating material. The results of the tests are plotted in FIG. 5 along with theoretical calculations for $\epsilon_d$=2.5 under uniform and non-uniform field conditions. The non-uniform field calculation was estimated by applying a 33% reduction factor to the uniform-field calculation, and the PDEV was estimated by applying an additional 15% reduction factor. An insulating thickness threshold of approximately 25 mils is determined from the graph because the applied voltage, for example, should be below both the PDIV and PDEV (the partial discharge voltage thresholds).

A safety margin may be used in determining the insulation threshold thickness such that the insulating system is free of partial discharge at a multiple of the applied voltage. For example, an insulating threshold thickness of approximately 40 mils (0.04 inches) is determined from the graph because the operating voltage, including a 50% safety margin (i.e., 1.5 kV), should be below both the PDIV and the PDEV.

Referring again to FIG. 4, once the insulating thickness is determined, it must be determined if the inductance of the bus bar arrangement is at or below the target inductance (i.e., low inductance). From the graph, assuming the aspect ratio of 7, it is determined that at an insulation thickness of 40 mils (0.04 inches) the inductance of the bus bar arrangement is approximately 9 nH and the target inductance is achieved.

Thus, for a target inductance of 10 nH, an applied voltage of 1 kV, an aspect ratio of 7 and an insulating material with a dielectric constant of 2.5, such as polypropylene, an insulating material thickness of 40 mils (0.04 inches) is appropriate to minimize the partial discharge in the insulating system.

Alternatively, the insulation thickness threshold is determined using Equation 3. As an example, for a required PDEV of 1.0 kV under non-uniform field conditions ($\beta$=0.57) and a polypropylene insulating material ($\epsilon_d$=2.5), yields an insulation threshold thickness of 18.2 mils by equation 3:

$$\delta_{d\_THRESHOLD} = 2.5 \times \left( \frac{1000}{0.57 \times 650} \right)^2 = 18.2 \text{ mils.}$$

If a 50% safety margin is added to the required PDEV (1.5 kV) under the same conditions, equation 3 yields 40.9 mils:

$$\delta_{d\_THRESHOLD} = 2.5 \times \left( \frac{1500}{0.57 \times 650} \right)^2 = 40.9 \text{ mils}$$

Other values of $\delta_{d\_THRESHOLD}$ may be used, such as from 0.001 to 0.10 inches.

Figure 6:
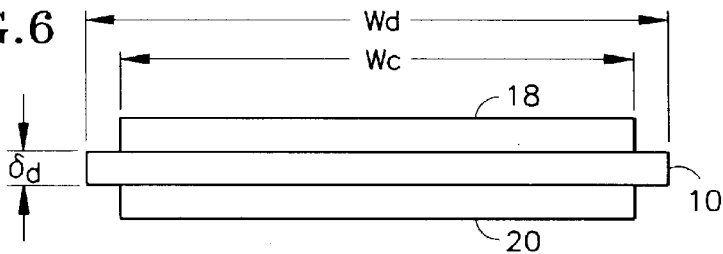
FIG. 6 is a simplified diagram of one embodiment of a bus bar assembly constructed in accordance with the present invention.
Figure 7:
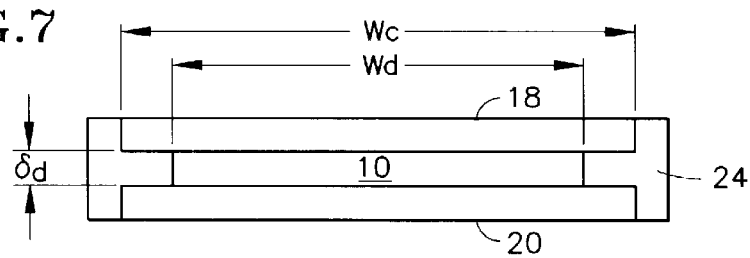
FIG. 7 is a simplified diagram of one embodiment of a bus bar assembly constructed in accordance with the present invention.
Figure 8:
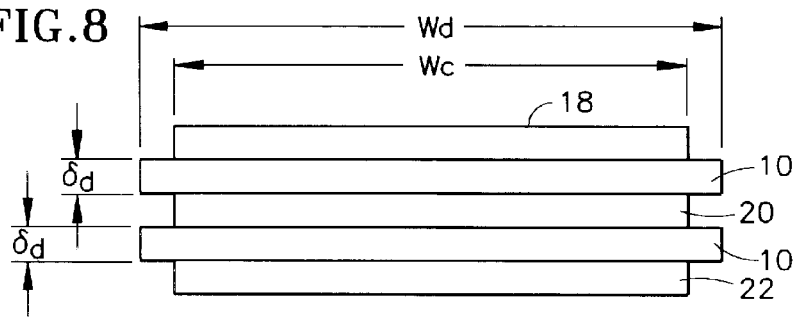
FIG. 8 is a simplified diagram of one embodiment of a bus bar assembly constructed in accordance with the present invention.

Referring to FIGS. 6, 7, 8, several embodiments of low inductance bus bar arrangements constructed in accordance with the principles of the present invention are shown. In each embodiment, elongated electrical conducting bars 18,20,22 having substantially planar sides are oriented such that they extend lengthwise substantially parallel to each other and with their planar sides facing one another. A dielectric insulating system 10 also being elongated is positioned between the electrical conducting bars 18,20,22. The thickness $d_d$ of the insulating system 10 is determined as described above. The conducting bar 18 is at a different electric potential than conducting bar 20. One conducting bar may be designated with a positive polarity and the other conducting bar designated with a negative polarity.

In one embodiment, the conducting bars and the insulating system are assembled with liquid or film adhesive using light pressure only, without the need for curing. In the past, adhesives required special lamination techniques under high temperatures and pressures because of the potential for forming voids. However, the present invention minimizes the potential discharge and thus the presence of voids is not a concern in a low inductance bus bar constructed in accordance with the principles of the present invention. Alternatively, the bus bar may be assembled by conventional means such as threaded rods or bolts and the invention is not intended to be limited to any particular fastening means.

Figure 9:
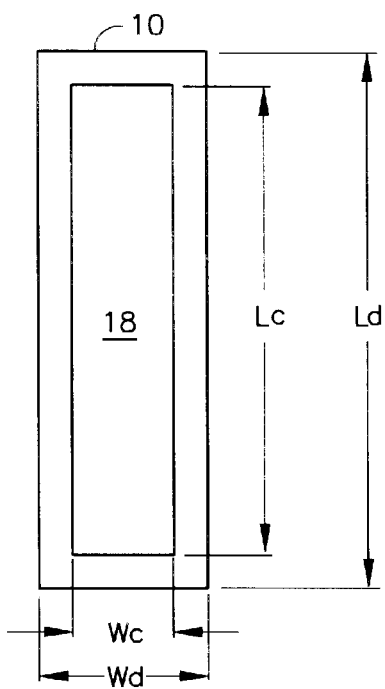
FIG. 9 is a simplified diagram of one embodiment of a bus bar assembly constructed in accordance with the present invention.

In one embodiment, as shown in FIGS. 6, 8, the width $W_d$ of the insulating system 10 is greater than the width $W_c$ of the conductors 18,20,22. Also, as shown in FIG. 9, the length $L_d$ of the insulating system 10 is greater than the length $L_c$ of the conductors. This configuration increases the distance between the conductors so as to avoid voltage arcing caused by surface tracking.

Alternatively, as shown in FIG. 7, the width $W_d$ of the insulating material is smaller than the width $W_c$ of the conductors. In this embodiment, the length of the insulating material may also be smaller than the length of the conductors. An epoxy fill 24 may be used to seal the edges of the bus bar arrangement so as to avoid possible surface tracking.

Referring to FIG. 8, the bus bar arrangement constructed in accordance with the principles of the present invention is not limited to any particular number of elongated conducting bars. FIG. 8 shows a bus bar arrangement having three conductors wherein conducting bars 18,22 may be at a first electric potential (i.e., positive polarity) and conducting bar 20 may be at a second electric potential (i.e., negative polarity) which is different from the first electric potential. Disposed between each conducting bar are insulating systems 10. The thickness of the insulating systems 10 are determined as described above.

Various changes to the above description may be made without departing from the spirit and scope of the present invention as would be obvious to one of ordinary skill in the art of the present invention.

What is claimed is:

1. A low inductance bus bar arrangement comprising:

two electrical conductors each having a substantially planar area; and an insulating system disposed between said conductors, said insulating system having an insulating material, the insulating material having a thickness equal to or greater than a thickness threshold such that partial discharge in the insulating system is minimized, wherein said thickness threshold is determined in accordance with the following relationship:

$$\delta_{d\_THRESHOLD} = \epsilon_d \times \left( \frac{PD_{THRESHOLD}}{\beta \times 650} \right)^2$$

wherein $\delta_{d\_THRESHOLD}$ is the thickness threshold;

$\epsilon_d$ is a dielectric constant of the insulating material;

$PD_{THRESHOLD}$ is a partial discharge voltage threshold; and $\beta$ is a coefficient which is selected as follows:

$\beta=1$ for inception voltage under uniform fields $\beta=0.67$ for inception voltage under non-uniform field (33% reduction)

$\beta=0.85$ for extinction voltage under uniform fields (15% reduction)

$\beta=0.57$ for extinction voltage under non-uniform fields.

2. A low inductance bus bar arrangement as recited in claim 1, wherein said insulating material has a thickness of substantially 0.04 inches.

3. A low inductance bus bar arrangement as recited in claim 1, wherein said thickness threshold is substantially in the range of 0.001 inches to 0.10 inches.

4. A low inductance bus bar arrangement as recited in claim 1, wherein said insulating material comprises an organic material.

5. A low inductance bus bar arrangement as recited in claim 1, wherein said insulating material comprises polypropylene.

6. A low inductance bus bar arrangement as recited in claim 1, wherein said insulating material comprises polyester.

7. A low inductance bus bar arrangement as recited in claim 1, wherein said insulating material comprises aramid paper.

* * * * *